US012237198B2

(12) United States Patent
Remillard et al.

(10) Patent No.: US 12,237,198 B2
(45) Date of Patent: Feb. 25, 2025

(54) AREA CAMERA SUBSTRATE PRE-ALIGNER

(71) Applicant: Onto Innovation Inc., Wilmington, MA (US)

(72) Inventors: Jason Paul Remillard, Groton, MA (US); Neil Casa, Wilmington, MA (US); Stephen W. Into, Harvard, MA (US)

(73) Assignee: Onto Innovation Inc., Wilmington, MA (US)

( * ) Notice: Subject to any disclaimer, the term of this patent is extended or adjusted under 35 U.S.C. 154(b) by 59 days.

(21) Appl. No.: 17/840,154

(22) Filed: Jun. 14, 2022

(65) Prior Publication Data

US 2023/0317490 A1    Oct. 5, 2023

Related U.S. Application Data

(60) Provisional application No. 63/325,924, filed on Mar. 31, 2022.

(51) Int. Cl.
- *G03F 7/20* (2006.01)
- *G06T 7/00* (2017.01)
- *H01L 21/68* (2006.01)

(52) U.S. Cl.
CPC .......... *H01L 21/681* (2013.01); *G06T 7/0004* (2013.01); *G06T 2207/20081* (2013.01);
(Continued)

(58) Field of Classification Search
CPC ............. H01L 21/681; H01L 21/67259; G06T 7/0004; G06T 2207/20081; G06T 2207/20084; G06T 2207/30148
See application file for complete search history.

(56) References Cited

U.S. PATENT DOCUMENTS

| 5,513,948 A * | 5/1996 | Bacchi | H01L 21/681 414/936 |
| 6,275,742 B1 * | 8/2001 | Sagues | H01L 21/681 414/936 |

(Continued)

FOREIGN PATENT DOCUMENTS

| KR | 20200111797 | 9/2020 |
| TW | 201631678 | 9/2016 |

(Continued)

OTHER PUBLICATIONS

"International Application Serial No. PCT US2023 016866, International Search Report mailed Jul. 18, 2023", 3 pages.

(Continued)

*Primary Examiner* — Mesfin T Asfaw

(74) *Attorney, Agent, or Firm* — Schwegman Lundberg & Woessner, P.A.

(57) ABSTRACT

Various examples include a substrate pre-aligner system that can align substrates by detecting a fiducial on the substrate, determine an amount of bow in the substrate, and determine other characteristics of the substrate. In one example, by imaging both a 0-degree orientation and after a single 180-degree rotation of the substrate, the pre-aligner of the disclosed subject-matter can determine, for example, a location of the fiducial and bow in the substrate. In other embodiments, multiple cameras are used to capture images of the substrate substantially simultaneously and determine, for example, a location of the fiducial and bow in the substrate. The multiple camera embodiment can also allow (Continued)

a higher throughput of substrates as compared with the 0-degree to 180-degree embodiment. Other systems and methods are also disclosed.

35 Claims, 6 Drawing Sheets

(52) U.S. Cl.
CPC ............. *G06T 2207/20084* (2013.01); *G06T 2207/30148* (2013.01)

(56) References Cited

U.S. PATENT DOCUMENTS

| | | |
|---|---|---|
| 2004/0179181 A1 | 9/2004 | Van |
| 2005/0016818 A1 | 1/2005 | Ito et al. |
| 2008/0080845 A1 | 4/2008 | Chen et al. |
| 2013/0089935 A1* | 4/2013 | Vukkadala ........ H01L 21/67288 356/601 |
| 2013/0148878 A1 | 6/2013 | Lin et al. |
| 2014/0365011 A1 | 12/2014 | Hosek et al. |
| 2019/0005357 A1* | 1/2019 | Bhaviripudi ...... G06F 18/24133 |

FOREIGN PATENT DOCUMENTS

| | | |
|---|---|---|
| TW | 201707123 | 2/2017 |
| TW | 202407840 | 2/2024 |
| WO | 2023192458 | 10/2023 |

OTHER PUBLICATIONS

"International Application Serial No. PCT US2023 016866, Written Opinion mailed Jul. 18, 2023", 6 pages.

"Taiwanese Application Serial No. 112112300, Office Action mailed Feb. 29, 2024", With English Machine Translation, 25 pgs.

"Taiwanese Application Serial No. 112112300, Response filed Jun. 11, 2024 to Office Action mailed Feb. 29, 2024", With English Machine Translation, 11 pgs.

"Taiwanese Application Serial No. 112112300, Decision of Rejection mailed Aug. 16, 2024", with manual English translation, 22 pages.

"International Application Serial No. PCT US2023 016866, International Preliminary Report on Patentability mailed Oct. 10, 2024", 8 pgs.

* cited by examiner

AREA CAMERA SUBSTRATE PRE-ALIGNER

This application claims the benefit of priority to U.S. Provisional Patent Application Ser. No. 63/325,924, filed on 31 Mar. 2022, and entitled "AREA CAMERA SUBSTRATE PRE-ALIGNER," which is incorporated herein by reference in its entirety.

TECHNOLOGY FIELD

The disclosed subject-matter is related generally to the field of substrate-inspection and metrology tools used in the semiconductor and allied industries (e.g., flat-panel display and solar-cell production facilities). More specifically, in various embodiments, the disclosed subject-matter is related to a substrate pre-aligner that can, for example, align substrates, determine an amount of bow in the substrates, as well as making a determination of other characteristics of the substrates. In various embodiments, the disclosed subject-matter can align bonded wafers (e.g., a gallium arsenide (GaAs) wafer bonded on a clear sapphire wafer).

BACKGROUND

Various types of substrates, such as semiconductor wafers, are typically placed into various types of production tools for processing and metrology tools for measurement within a fabrication facility (e.g., such as an integrated circuit manufacturing-facility). A robot is used to place the substrates onto a substrate stage within the tool, to prepare the substrate for processing within a processing chamber or measurement within a metrology tool. Typically, the substrate has one or more fiducial indicators (e.g., a notch or flat portion on the edge of the substrate) etched or otherwise formed. into the edge of the substrate. The fiducial indicator is arranged in a unique orientation along the substrate to indicate characteristics of the substrate, such as an alignment along a crystallographic orientation of the substrate (e.g., the notch may be arranged within ±1° of a {110} orientation). Therefore, for various types of processing operations, which may rely on a known crystallographic orientation, it is desirable to align the fiducial mark in a specific orientation with reference to the processing chamber. There may be similar considerations regarding alignment of the substrate for metrology tools as well.

SUMMARY

This document describes, among other things, a substrate pre-aligner that can, for example, align a substrate with a fiducial, determine an amount of bow in the substrate, as well as making a determination of other characteristics of the substrate.

In various embodiments, the disclosed subject matter is an apparatus to detect and pre-align a fiducial located on a substrate to a predetermined location on a substrate holder. The apparatus includes at least one camera to be positioned over the substrate when the substrate is located on the substrate holder. The at least one camera is configured to capture a plurality of images of at least a top surface of the substrate, with at least two of the plurality of images showing at least partially unique views of the substrate. A hardware-based processor is configured to determine a location of an edge of the substrate based on the plurality of captured images. The hardware-based processor is further configured to determine a characteristic dimension of the substrate across the top surface, determine a location of the fiducial on the substrate, calculate at least an x-direction offset, a y-direction offset, and a theta-direction offset of the substrate from the predetermined location on the substrate holder, and determine a location of the fiducial based on the plurality of captured images.

In various embodiments, the disclosed subject matter is a method for pre-aligning a fiducial located on a substrate to a predetermined location on a substrate holder. The method includes capturing at least one first image of at least a top surface of the substrate and capturing at least one second image of at least the top surface of the substrate, where the at least one first image and the at least one second image show at least partially unique views of the substrate. The at least one first image and the at least one second image are processed to determine a location of the fiducial, with the processing further including calculating at least an x-direction offset, a y-direction offset, and a theta-direction offset of the substrate from the predetermined location on the substrate holder.

In various embodiments, the disclosed subject matter is a computer-readable medium containing instructions that, when executed by a machine, cause the machine to perform operations including receiving at least one first image of at least a top surface of the substrate and receiving at least one second image of at least the top surface of the substrate. The at least one first image and the at least one second image show at least partially unique views of the substrate. The at least one first image and the at least one second image are processed to determine a location of the fiducial on the substrate. The processing further including calculating at least an x-direction offset, a y-direction offset, and a theta-direction offset of the substrate from the predetermined location on the substrate holder, and determining a location of the fiducial based on the at least one first image and the at least one second image.

In various embodiments, the disclosed subject matter is a method for pre-aligning a fiducial located on a substrate to a predetermined location on a substrate holder. The method includes capturing at least one unique image of the substrate after the substrate is placed on the substrate holder by each of a plurality of cameras; processing each of the captured images; determining at least one edge of the substrate from the processed images; determining a location of the fiducial on the substrate from the processed images; and calculating, from the processed images, at least an x-direction offset, a y-direction offset, and a theta-direction offset of the substrate from a predetermined location on the substrate holder.

BRIEF DESCRIPTION OF FIGURES

Various ones of the appended drawings merely illustrate example implementations of the present disclosure and should not be considered as limiting its scope.

DETAILED DESCRIPTION

Figure 1A:
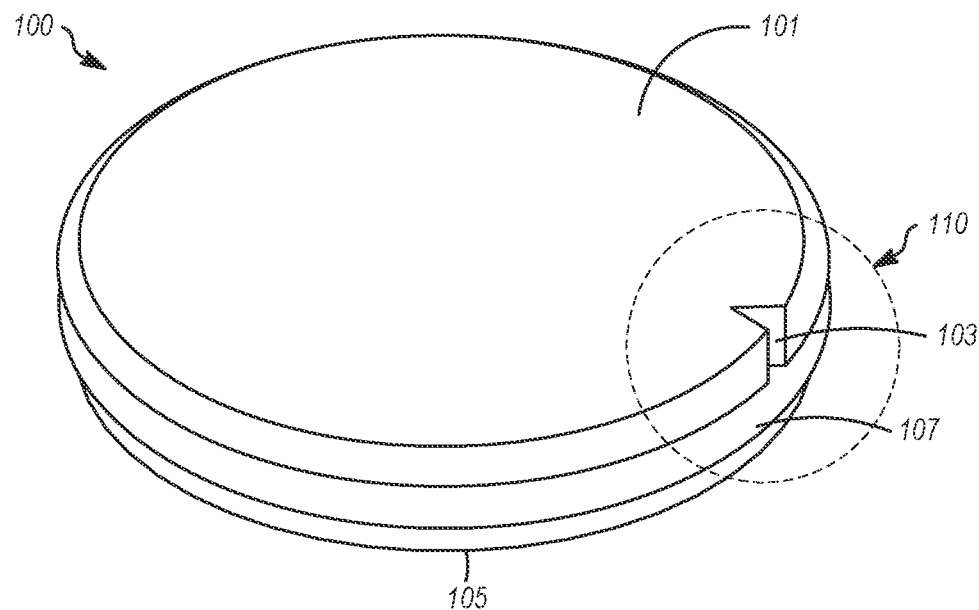
FIG. 1A shows a bonded substrate, which may be used with various embodiments of the disclosed subject matter.

The disclosed subject matter is directed to a substrate pre-aligner that can align a substrate as well as determine an amount of bow in the substrate. In various embodiments, the disclosed subject-matter can also align bonded wafers (e.g., a GaAs wafer bonded on a clear sapphire wafer). Conventional pre-aligners typically are unable to perform these functions. For example, since, in the case of bonded wafers, wax is often used to bond wafers, conventional pre-aligners typically cannot differentiate a fiducial, such as a notch on the GaAs wafer, because the wax can protrude into the notch. Further, by imaging both a 0-degree and a single 180-degree rotation of the substrate, the pre-aligner of the disclosed subject matter can determine and quantify an amount of bow in the substrate if present.

In one example, the disclosed subject matter can use a color area camera. In embodiments, the pre-aligner can be configured with a single camera arranged overhead from a face of the substrate observing the entire substrate. In embodiments, the pre-aligner can be configured with two cameras observing opposite portions of the substrate, or four cameras observing four quadrants of the substrate. In another example, two of the four cameras can be placed above the substrate and the remaining two cameras are placed below the substrate. As discussed in more detail with reference to FIG. 5, below, images captured by the one or more cameras may then be processed by a machine-learning framework to detect fiducial marks on the substrate. The machine-learning framework can also be used to determine other features or characteristics of the substrate, such as whether the substrate is bowed or warped.

As disclosed herein, a machine-learning framework, such as a convolutional neural-network (CNN or convnet), may be used to process image data. Processing image data includes, for example, finding spatial relationships within captured images to determine features or characteristics of substrates as disclosed herein. A generalized example of a machine-learning framework that can be used with the disclosed subject matter is described in more detail below.

Using the collected images as an input to the machine-learning framework, the machine-learning framework produces at least one output that indicates, for example, a location of the fiducial, an amount the substrate is misaligned on the substrate stage (e.g., a misalignment in an x-direction, a y-direction, a z-direction, and a theta-direction), and an amount of bow or warp in the substrate.

In embodiments, the image or images of the substrate captured by the one or more cameras are processed in the machine-learning framework to determine features or characteristics of the substrate (e.g., to differentiate the imaged substrate from the wax and the carrier substrate, if present, to determine a location of one for more fiducials, to detect and quantify an amount of bow in the substrate, if present, and to detect correction coordinates for the substrate if needed.)

For example, with reference now to FIG. 1A, a bonded substrate 100, which may be used with various embodiments of the disclosed subject matter, is shown. FIG. 1A is shown to include a substrate 101, a carrier substrate 105, and a bonding agent 107. The bonding agent 107 is used to bond the substrate 101 to the carrier substrate 105. The substrate 101 is also shown to include an example of a fiducial notch 103. As discussed herein, the fiducial notch 103 can be used to indicate, for example, an orientation along a crystallographic orientation of the substrate 101.

The substrate 101 may comprise, for example, various types of substrates, such as a wafer comprising elemental semiconductors (e.g., silicon or germanium), a wafer comprising compound semiconductors (e.g., gallium arsenide (GaAs) or gallium nitride (GaN)), or variety of other substrate types known in the art (including conductive, semi-conductive, and non-conductive substrates). Consequently, the substrate 101 may comprise, for example, any one or more of 400 mm, 300 mm, 200 mm, 150 mm, 125 mm, and 100 mm round substrates (e.g., wafers), including opaque (e.g., at visible wavelengths), clear, and bonded substrates. Each of the listed substrate types may include notches and single-flat or single-flat and secondary-flat fiducials. In embodiments, the material comprising the carrier substrate 105 may comprise a different material than the material comprising the substrate 101. In other embodiments, the carrier substrate 105 may comprise the same material as the substrate 101. In embodiments, the size of the carrier substrate 105 may be the same as or similar to the size of the substrate 101. In other embodiments, the size of the carrier substrate 105 may be different than the size of the substrate 101. In embodiments, the shape of the carrier substrate 105 may be similar to or different from than the shape of the substrate 101.

The bonding agent 107 may comprise various types of wax to adhere the substrate 101 to the carrier substrate 105. However, since wax is often used to bond various types of substrates 101, 105 to each other, the wax can protrude into the fiducial notch 103 as highlighted by a portion 110 of the bonded substrate 100 and discussed below with regard to FIG. 1B.

Figure 1B:
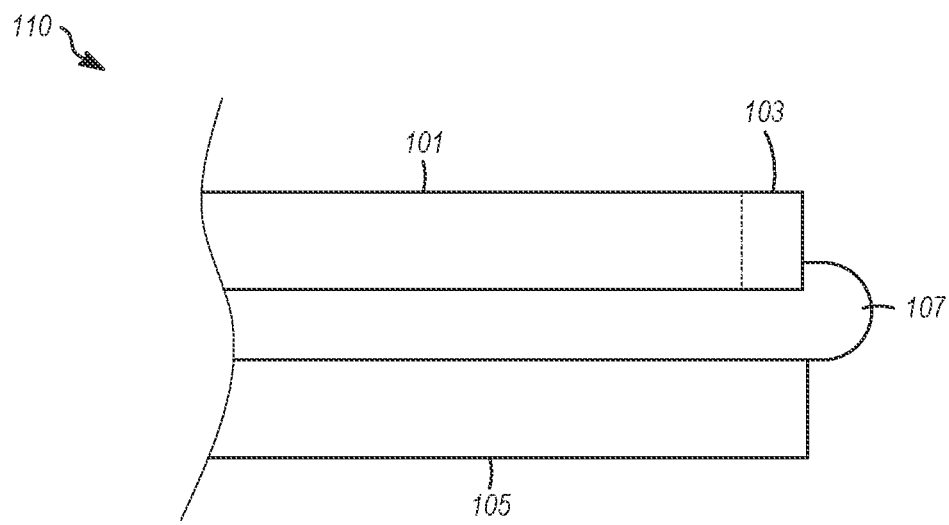
FIG. 1B shows a cross-sectional portion of the bonded substrate of FIG. 1A.

The portion 110 is shown in FIG. 1B as a cross-sectional portion of the bonded substrate 100 of FIG. 1A. As is shown in FIG. 1B, the bonding agent 107 at least partially fills the fiducial notch 103 of the substrate 101. The bonding agent may also obscure one or more edges of either the substrate 101 and/or the carrier substrate 105. Currently available pre-aligners are unable to differentiate the bonding agent 107 from the notch or other fiducial, or edges of the substrate 101 and/or the carrier substrate 105. Therefore, conventional pre-aligners are typically unable to at least, align the fiducial notch 103 to a processing system or metrology system into which the bonded substrate 100 is being introduced. However, a person of ordinary skill in the art understands that many, for example, substrate-processing systems, require the substrate 101 to be in a pre-defined orientation prior to being placed within the processing system.

Figure 2A:
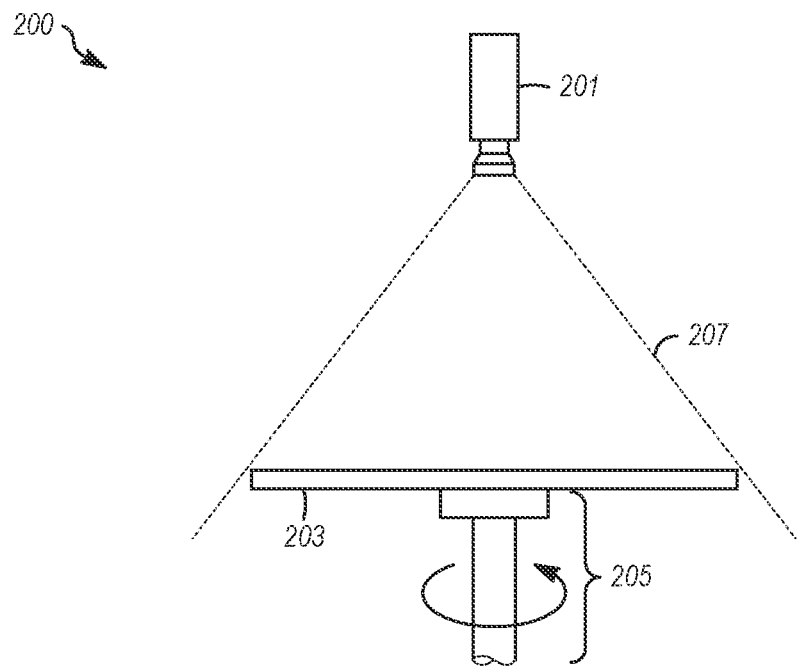
FIG. 2A shows an example of a single-camera pre-aligner system that may be used to pre-align both bonded and unbonded substrates in accordance with various embodiments of the disclosed subject matter.

FIG. 2A shows an example of a single-camera pre-aligner system 200 that may be used to pre-align substrates in accordance with various embodiments of the disclosed subject matter. The single-camera pre-aligner system 200 may also be used to determine and quantify characteristics such as bow and warp, if present, in the substrate, as well as other characteristics of the substrate. The single-camera pre-aligner system 200 may operate as either a standalone pre-aligner system, a pre-aligner system that may be embedded into process and metrology tools, or as a pre-aligner system that may be embedded into robotic substrate-handling systems.

The single-camera pre-aligner system 200 is shown to include an overhead camera 201, having a field-of-view 207 that substantially covers an uppermost area of a substrate 203 (e.g., the bonded substrate 100 of FIG. 1A or any bonded substrate or unbond.ed substrate) that is placed on a translational stage 205. In various embodiments, the translational stage 205 is configured to move the substrate 203 in, for example, an x-direction, a v-direction, a z-direction, and a theta-direction (rotating the substrate 203 as indicated by the arrow surrounding the translational stage 205). In various embodiments, the translational stage 205 is configured to move the substrate 203 in, for example, a theta-direction only. The translational stage 205 may be activated (rotated) using, for example, a brushless DC motor. A rotary encoder may be added to the translational stage 205 to rotate the substrate 203 to a known position (e.g., 180°) from a given starting point. In a specific exemplary embodiment, the rotary encoder may have a resolution of 25,000 counts per revolution. However, greater or lesser values of resolution may be selected depending on a given application and level of rotational accuracy desired.

In various embodiments, the translational stage 205 of the single-camera pre-aligner system 200 may include a number of various types of substrate-holding mechanisms known in the art.

For example, in various embodiments, the translational stage 205 may include a substrate pin-lifter to hold the substrate 203. A typical substrate pin-lifter is comprised of a number of pins (e.g., typically three pins comprising metal, sapphire, or metal tipped with sapphire), a pneumatic actuator to raise the substrate pin-lifters, and one or more position sensors to gauge a level of the substrate pin-lifters. In various embodiments, the translational stage 205 may include an electrostatic chuck (ESC), known in the relevant art to hold the substrate 203. In various embodiments, the translational stage 205 may include a vacuum chuck, known in the relevant art to hold the substrate 203.

The overhead camera 201 may include one or more lenses (e.g., there may be a single variable focal-length lens or a plurality of single focal-length lenses) and an image sensor (e.g., a CCD array, a CMOS-based sensor, an active-pixel sensor, or other sensor types). The overhead camera 201 may also include camera boards having related circuitry to facilitate image extraction. In one example, the overhead camera 201 is a color camera, A color camera may be desirable since captured colors can help differentiate the substrate 101 from the bonding agent 107 and the carrier substrate 105. Also, machine-learning frameworks, discussed below, may be trained on color images, which would otherwise cause integration challenges for gray-scale images collected from a monochrome camera. However, with a known substrate type using a network trained using gray-scale images, a monochromatic camera may be used as well.

In various embodiments, multiple cameras may be used as noted herein. A linear or line-type camera as used in conventional systems may be replaced by an area camera as discussed herein. In embodiments, the overhead camera 201 may comprise a camera (e.g., a color area-camera) with a resolution sufficient to identify the fiducial notch 103 (or other fiducial marker). In embodiments, the overhead camera 201 may comprise a camera with a resolution sufficient to read identification (ID) numbers (not shown) etched or otherwise formed onto a face of the substrate 101, 203. In a specific exemplary embodiment, and depending at least partially on a physical size of the ID number, the overhead camera 201 may have a resolution of 25 megapixel or higher.

As shown in FIG. 2A, the overhead camera 201 may be mounted approximately perpendicular to an uppermost face of the substrate 203. As noted above, the field-of-view 207 of the overhead camera 201 substantially covers an uppermost area of a substrate 203.

In other embodiments, not shown explicitly, a pre-aligner system may include, for example, two cameras observing different (e.g., opposite) portions of the substrate 203. In various other embodiments, a pre-aligner system may include, for example, four cameras observing four quadrants of the substrate 203. The portions or quadrants viewed by the cameras may or may not overlap. In various other embodiments, two of the four cameras may be placed above the substrate 203 and the remaining two cameras may be placed below the substrate 203.

An example of a method for detecting fiducial marks using the single-camera pre-aligner system 200 is discussed with reference to FIG. 3, below. A method similar to the method of FIG. 3 may also be used with, for example, the two-camera or the four-camera pre-aligner systems disclosed herein.

Figure 2B:
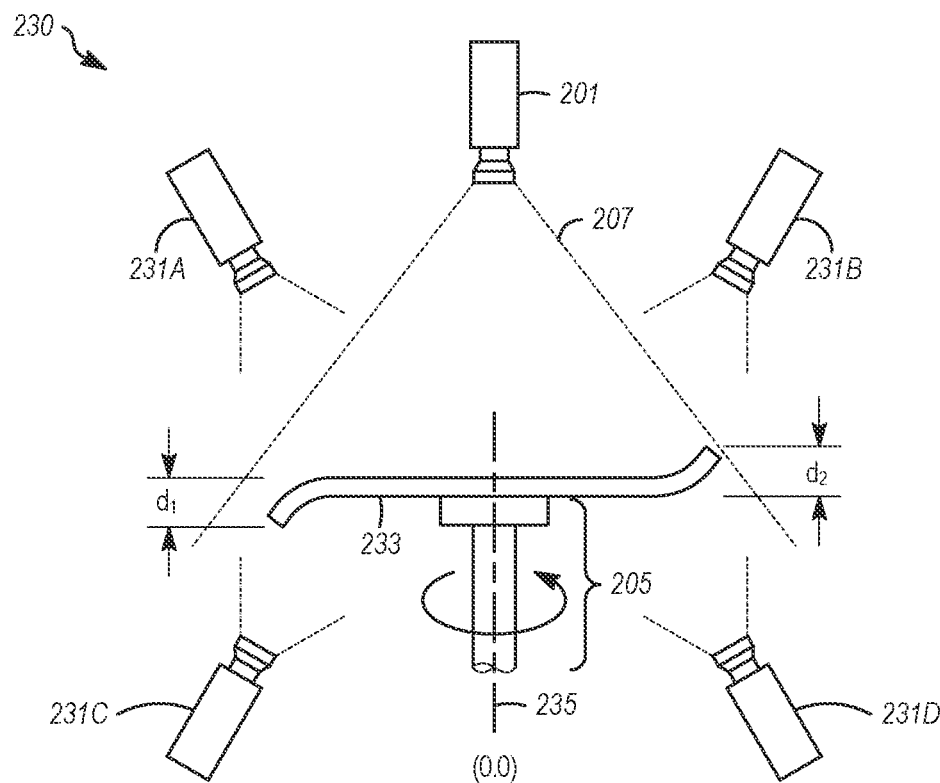
FIG. 2B shows an example of a multi-camera pre-aligner system that may be used to pre-align both bonded and unbonded substrates in accordance with various embodiments of the disclosed subject matter.

FIG. 2B shows an example of a multi-camera pre-aligner system 230 that may be used to pre-align substrates in accordance with various embodiments of the disclosed subject matter. The multi-camera pre-aligner system 230 may also be used to determine and quantify characteristics such as bow and warp, if present, as well as other characteristics of the substrate. FIG. 2B is shown to include the overhead camera 201, as well as two cameras 231A, 231B mounted above a substrate 233, and two cameras 231C, 231D, mounted below the substrate 233.

The two cameras 231A, 231B mounted above the substrate 233 and the two cameras 231C, 231D mounted below the substrate 233 may be the same as or similar to the overhead camera 201, described above with reference to FIG. 2A. Also, more than two cameras may be mounted either above or below the substrate. Further, the number of cameras mounted above the substrate 233 does not need to be the same as the number of cameras mounted below the substrate 233.

In the multi-camera pre-aligner system 230 of FIG. 2B, the overhead camera 201 may be considered as optional. In this embodiment, the two cameras 231A, 231B mounted above the substrate 233 and the two cameras 231C, 231D mounted below the substrate 233 may be used to capture all images of the substrate 233 as described below. If the overhead camera 201 is used in an embodiment, the overhead camera 201 may be mounted substantially perpendicular to an uppermost face of the substrate 233 along a centerline 235 of the translational stage 205.

The substrate 233 is shown as including an exaggerated bow (and/or warp) to better explain various embodiments of the disclosed subject matter. The bow may be symmetrical or asymmetrical. For example, an amount of bow, $d_1$, on a left-side of the substrate 233 may be the same as an amount of bow, $d_2$, on a right-side of the substrate 233 if the bow is substantially symmetrical. In a case of a substantially asymmetrical bow of the substrate 233, the amount of bow, $d_1$, on the left-side of the substrate 233 may be different from the amount of bow, $d_2$, on the right-side of the substrate 233. In either case, of symmetry or asymmetry of bow, the single-camera pre-aligner system 200 of FIG. 2A or the multi-camera pre-aligner system 230 of FIG. 2B can be used to determine the amount of bow. Such a determination is described below.

With regard to substrate alignment characteristics of the single-camera pre-aligner system 200 and the multi-camera pre-aligner system 230, and in a specific exemplary embodiment, the single-camera pre-aligner system 200 and the multi-camera pre-aligner system 230 are configured to align a bonded or unbonded substrate in about 4 seconds or less. The lateral accuracy (e.g., to translate the substrate 203, 233 laterally in x-directions and y-directions) of the translational stage 205 may be within, for example, ±50 µm. A rotational accuracy (to rotate the substrate 203, 233 to a predetermined angle to align the fiducial notch 103 of FIGS. 1A and 1B) of the translational stage 205 may be within, for example, ±0.06°.

In one high-level exemplary method for using the pre-aligner systems 200, 230 may include various steps. However, not all of the steps shown may be needed for a given operation. The exemplary steps can include at least some of the following steps discussed below.

An end-effector of a robotic arm places a substrate (e.g., the substrate 203, 233) on a pre-aligner chuck (e.g., a substrate holder, such as the translational stage 205). The camera (e.g., the overhead camera 201) or cameras (e.g., the overhead camera 201 and/or one or more of the cameras 231A, 231B, 231C, 231D) captures an image of the substrate 203, 233. Depending on the number of cameras used, the process may vary.

With a single camera (e.g., the overhead camera 201), the substrate is rotated at least once 180 degrees and at least one new image is captured. Consequently, with one 180° rotation and two images (one in each orientation of the substrate 203, 233), several characteristics e.g., location of a fiducial (a notch), theta-offset, x-direction offset and y-direction offset, etc.) regarding the substrate may be determined quickly. A location of substrate edge or edges in the captured images, in 180° pairs if using the single camera also allows for compensation of bow in the substrate. With multiple cameras, the substrate may not need to be rotated as each camera is often capturing a unique or partially unique portion of the substrate. Therefore, no rotation may be needed with multiple cameras.

The captured images are processed (e.g., by a machine-learning framework or convolutional neural-network as described below with reference to FIG. 5). The following information may be extracted from the images: a location of the edge (e.g., on a round substrate) or edges (e.g., on a square substrate) of the substrate; a location of the fiducial(s) on the substrate; a determination of the substrate size (e.g., diameter); an amount the substrate is misaligned on the substrate stage (e.g., a misalignment in an x-direction, a y-direction, a z-direction, and/or a theta-direction), and an amount of bow or warp in the substrate. If at least one topside camera has sufficient resolution, a topside substrate-identification (ID) number or code can be read from the images (e.g., in an optical character-recognition (OCR) operation). If a misalignment of the substrate is detected from the processed images, the system can calculate translational and theta corrections. The corrections can be transferred to, for example, the translational stage 205 or a transfer robot to correct the placement of the substrate 203, 233.

The fiducial(s) on the substrate 203, 233 can be observed directly by at least one camera, using, for example, and if needed, front-side lighting, back-side lighting, and/or a light reflector.

An angular misalignment of the substrate can be derived by observing, for example, a grid on the substrate (if present, such as on a wafer containing printed andior etched dice). In addition or alternatively, a misalignment of the substrate can be derived from a pre-learned pattern-recognition image. Lateral corrections can also be calculated (e.g., in an x-direction and a y-direction), if needed, from the captured images. A location of substrate edge or edges in the captured images, in 180° pairs if using a single camera (also used to compensate for bow in the substrate).

Continuing with an example method for using the pre-aligner systems 200, 230, for each captured image, the following operations may also be performed. A radial lens-correction may be inverted., if needed, to correct for lens distortions. For example, radial lens-distortion (e.g., a curvilinear distortion such as pincushion or barrel distortion) often exists in captured images as an artifact of the imaging system (e.g., a distortion originating with the lens). Estimating the radial lens-distortion, and preparing a radial lens-correction therefrom, can be realized using a convnet within the machine-learning framework described below, to prepare the radial lens-correction. A person of ordinary skill in the art will recognize that numerous architectures of a CNN can be used to perform a classification of images.

Pixels within the captured images can be converted to physical units (e.g., a linear dimension, such as millimeters) via an algorithm such as a direct linear transformation (DLT) transformation matrix. The DLT transformation matrix may be predetermined and embedded into the machine-learning framework or other processing environment. Either a two-dimensional. (2D) or a three-dimensional (3D) transformation matrix can be calculated to determine a translational and/or angular (theta) transformation used to move an observed substrate-location to a desired substrate-location.

If the pre-aligner has an XY (and optionally a Z) stage, transfer the translational corrections into the XY stage before the robot picks and removes the substrate from the translational stage. If the pre-aligner does not have an XY (or Z) stage, the translational corrections can be input directly into a transfer robot. If the pre-aligner has a theta stage, transfer the rotational correction into the theta stage before the robot picks and removes the substrate from the translational stage. If the pre-aligner does not have a theta stage, the rotational correction can be transferred directly to the transfer robot.

Figure 3:
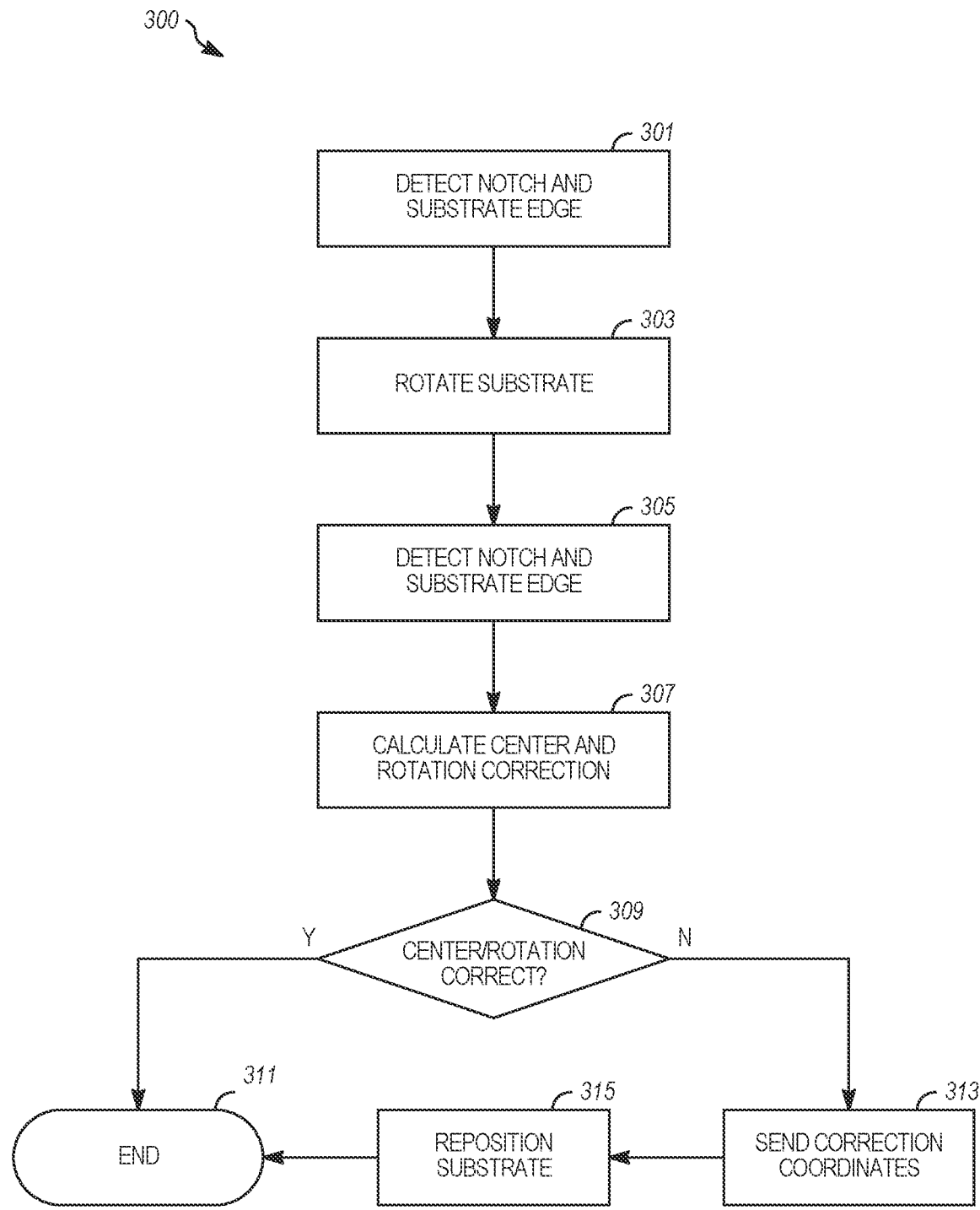
FIG. 3 shows a generalized example of a method for detecting fiducial marks (e.g., notches) on a substrate and detecting correction coordinates of the substrate, in accordance with various embodiments of the disclosed subject matter.

FIG. 3 shows a generalized example of a method 300 for detecting fiducial marks (e.g., notches) on a substrate and detecting correction coordinates of the substrate in accordance with various embodiments of the disclosed subject matter. At operation 301, the method 300 attempts to detect a notch and one or more edges of a substrate. In operation 301, an image of the substrate (e.g., the substrate 203 or the substrate 233), including an edge (e.g., a round substrate) or edges (e.g., a square substrate) of the substrate and one or more fiducials (e.g., a notch) is captured by one or more cameras (e.g., the overhead camera 201 and/or the cameras 231A, 231B, 231C, 231D of FIGS. 2A and 2B). The image or images are capture after the substrate is loaded onto a translational stage (e.g., the translational stage 205 of FIG. 2A).

In the case of a single camera, after the first image is captured the substrate may be rotated about 1800 at operation 303. If more than one camera is used, either a smaller rotation of the substrate (e.g., about) 90° or no rotations are used depending on an angle-of-view of the cameras. Therefore, at least two of the multiple images show different views (e.g., at least partially unique views) of the substrate, With the multiple images captured by the single camera after rotations of the substrate, or with images captured by each of more than one camera, the images are transmitted to a machine-learning framework, described below with reference to FIG. 5.

The machine-learning framework may be proximate to (e.g., in-situ) the pre-aligner system 200, 230. Alternatively, the machine-learning framework may be located remotely from the pre-aligner system 200, 230. In other embodiments, components of the machine-learning framework may be distributed with some components located at or near the pre-aligner system 200, 230 and other components located remotely from the pre-aligner system 200, 230.

After the substrate is rotated at operation 303 if needed, an additional image the of the substrate is captured by the one or more cameras at operation 305. The additional image of the substrate allows for a comparison of the edge or edges of the substrate with the first image. If edges are not aligned from the first image to the additional image when the two images are overlayed on each other (e.g., virtually overplayed in the machine-learning framework), then a translational error in the location of the substrate is present. A comparison of the first image to the additional image also allows for the fiducial mark to be better delineated. All images are transferred to the machine-learning framework to calculate a center offset (e.g., in at least an x-direction and a y-direction) and a rotational correction, if needed, at operation 307.

A decision is made at operation 309 as to whether the center of the substrate and the rotational orientation of the substrate are correct. For example, based on the detection of the edges of the substrate, a determination can be inad.e whether the location of each edge is symmetrical with reference to a calculated center of the substrate. If the center and rotational orientation are correct, the method 300 ends at operation 311.

If at least one of the center and rotational orientation are incorrect, the method 300 continues at operation 313 to transfer correction coordinates (e.g., x-offsets, v-offsets, and/or theta-offsets) to, for example, the translational stage 205 or the robotic-transfer mechanism for the substrate, as described above. Based on the transferred values of the correction coordinates, the substrate is repositioned at operation 315, The method 300 ends at operation The disclosed subject matter may use, for example, a deep-convolutional neural-network in the machine-learning framework. The deep-convolutional neural-network is based on a number of images to characterize the images of the substrate captured by the one or more cameras. The characterized images can then be used to describe features or characteristics of the substrate (e.g., to differentiate the imaged substrate from the wax and the carrier substrate, if present, to determine a location of one for more fiducials, to detect and quantify an amount of bow in the substrate, if present, and to detect correction coordinates if needed). To avoid having to collect millions of images, transfer learning may be used. In examples, the number of images typically used to train the network may be from about 5000 images to about 50,000 images. The training starts with a pre-trained network. Such a training regimen limits computational requirements that are frequently encountered in more complex deep-convolutional neural-network systems.

The training may start with a mix of example images-including images of various types of substrates, with various types of fiducials, bonding agents (e.g., wax if the substrate is a bonded wafer), and substrate carriers. The images can include multiple images of a given substrate as described above. Other desired features of a substrate, such as substrate thickness (e.g., accounting for a z-offset), substrate bow, substrate warp, and substrate droop (e.g., from a thinned substrate) may be noted to adjust a locational position (e.g., a pick position) between the end-effector of a robot and the substrate due to one or more of the substrate features or characteristics. The characteristics may be used to, for example, avoid a collision between the end-effector of a robot and the substrate due to one or more of the substrate characteristics. Therefore, the training may start with a generalization of the captured images. Further, in addition to defining the characteristics of the substrate, an identification number (e.g., an ID number) or code associated with each substrate may be recorded as noted above.

A generalized substrate-characterization system, including at least a portion of a machine-learning network, may be used with or embedded into the machine of FIG. 5, as described below. Therefore, the generalized substrate-characterization system may first be used in a training mode, to train the machine-learning framework, and may then later be used in a normal-operation mode to detect features or characteristics of each substrate. In various embodiments, the training mode may be performed by a manufacturer of the substrate-characterization system. Data obtained from the training mode may then be used at, for example, a fabrication facility (e.g., a semiconductor-device manufacturer or "fab") to determine characteristics of each substrate used within the facility.

Figure 4:
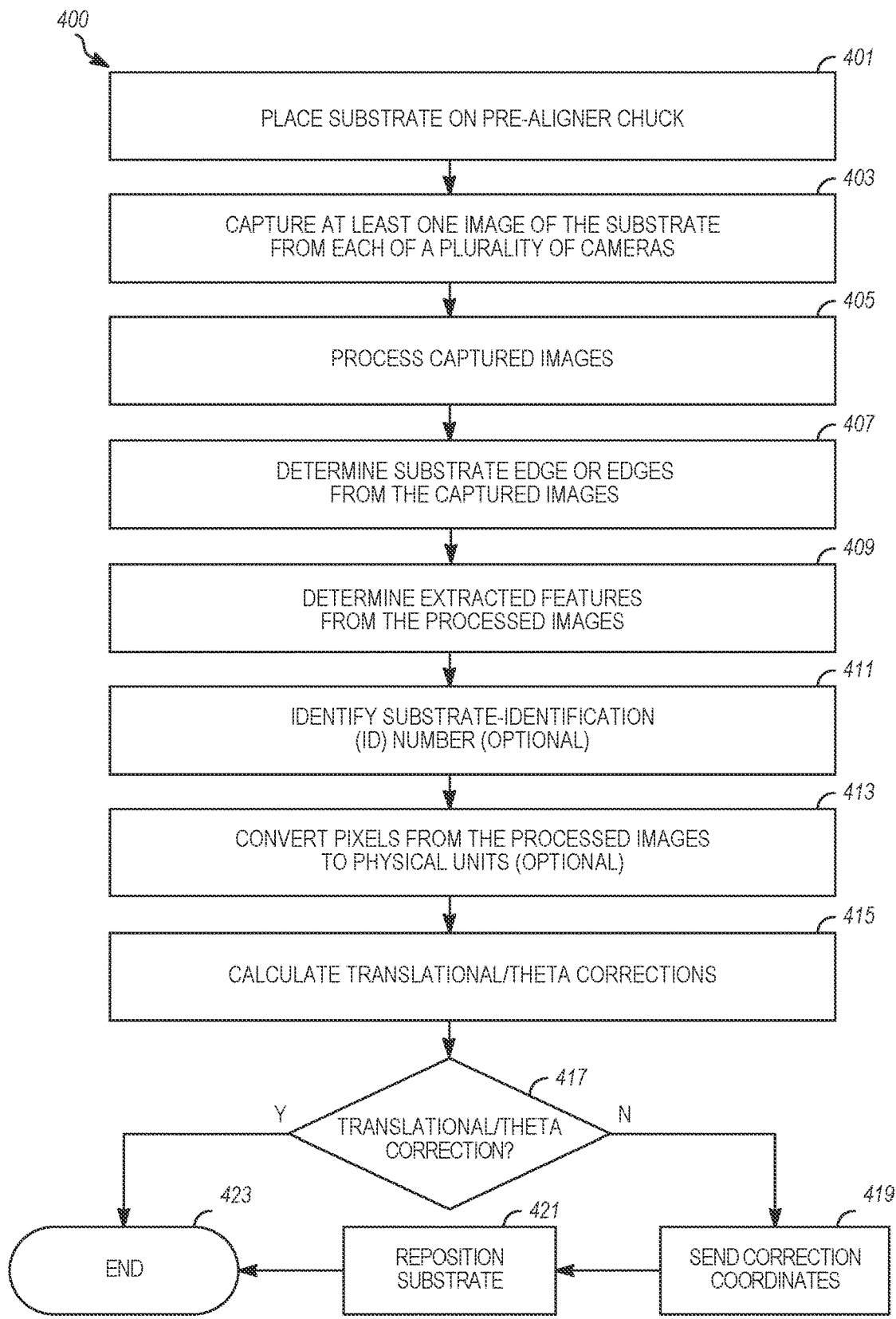
FIG. 4 shows a generalized example of a method for detecting fiducial marks and other characteristics of a substrate using multiple cameras, in accordance with various embodiments of the disclosed subject matter.

FIG. 4 shows a generalized example of a method 400 for detecting fiducial marks and other characteristics of a substrate (e.g., the substrate 233 of FIG. 2B) using multiple cameras, in accordance with various embodiments of the disclosed subject matter. In various embodiments, the multiple cameras can include the overhead camera 201 and at least one or one or more of the cameras 231A, 231B, 231C, 231D of FIG. 2B. In various embodiments, the overhead camera 201 may not be used. Instead, at least two of the cameras 231A, 231B, 231C, 231D are used.

In one high-level example, the method 400 for detecting fiducial marks and other characteristics of a substrate, using the multi-camera pre-aligner system 230 of FIG. 2B, may include various steps. However, not all of the steps shown may be needed for a given operation. The exemplary steps can include at least some of the following steps described below.

At operation 401, an end-effector of a robotic arm places a substrate (e.g., the substrate 233) on a pre-aligner chuck (e.g., a substrate holder, such as the translational stage 205). At operation 403, at least one unique image of the substrate is captured by each of multiple cameras (e.g., at least two cameras including the overhead camera 201 and/or one or more of the cameras 231A, 231B, 231C, 231D). Optionally, and at least partially dependent on an ambient light level on the substrate, the substrate can be observed directly by multiple ones of the cameras, using, for example, front-side lighting, back-side lighting, and/or a light reflector directed toward the substrate.

At operation 405, the captured images are processed (e.g., by a machine-learning framework or convolutional neural-network as described below with reference to FIG. 5). All captured images are transferred to the machine-learning framework to calculate at least a center offset (e.g., in at least an x-direction and a y-direction) and a rotational correction, if needed.

After the images are processed, a comparison of the multiple images of the substrate with one another allows for an edge or edges of the substrate to be determined at operation 407. If edges are not aligned from the first image to the additional image when the two images are overlayed on each other (e.g., virtually overlayed in the machine-learning framework or a processor comparing the processed images), then a translational error in the location of the substrate is present. A comparison of the multiple images with one another further allows for a determination of the presence and location of a fiducial mark. The comparison of one image from a first camera to at least one additional image from an additional samara or cameras also allows for the fiducial mark to be better delineated with reference to an actual location of the marks with reference to the remainder of the substrate and the edge or edges of the substrate.

Further, and as described herein, at least some of the following information may be extracted at operation 409 from the processed images: a location of the fiducial(s) on the substrate; a determination of the substrate size (e.g., diameter); an amount the substrate is misaligned on the substrate stage (e.g., a misalignment in an x-direction, a y-direction, a z-direction, and/or a theta-direction), and an amount of bow or warp in the substrate. If at least one topside camera (e.g., the overhead camera 201 and/or one or both of the cameras 231A, 231B) has sufficient resolution, a topside substrate-identification (ID) number or code can optionally be read from the images (e.g., in an optical character-recognition (OCR) operation) at operation 411.

At operation 413, pixel counts from the processed images may optionally be converted to physical units (e.g., units of millimeters or fractions of millimeters) to determine a size (e.g., diameter) of a substrate, the translational distance a substrate is off from being centered on the pre-aligner chuck, or other physical units of interest. The pixels can be converted to physical units via an algorithm, such as a direct linear transformation (DLT) transformation matrix. The DLT transformation matrix may be predetermined and embedded into the machine-learning framework of FIG. 5 or other processing environment. Either a two-dimensional (2D) or a three-dimensional (3D) transformation matrix can be calculated to determine a translational and/or angular (theta) transformation used to move an observed substrate-location to a desired substrate-location.

At operation 415, translational and/or theta corrections are calculated from the processed images. At operation 415, if a misalignment of the substrate is detected from the processed images, the system can calculate translational corrections (e.g., x-direction, y-direction, z-direction) and/or theta corrections. The corrections can be transferred to, for example, the translational stage 205 or a transfer robot to correct the placement of the substrate 233.

An angular misalignment of the substrate can be derived by observing, for example, a grid on the substrate 233 (if present, such as on a wafer containing printed and/or etched dice). In addition or alternatively, a misalignment of the substrate 233 can be derived from a pre-learned pattern-recognition image, which may include an alignment relative to the fiducial (although using the fiducial to determine angular misalignment is not needed when another alignment technique described herein is employed). Lateral corrections can also be calculated (e.g., in an x-direction and a y-direction), if needed, from the captured images.

A decision is made at operation 417 as to whether the center of the substrate and the rotational orientation of the substrate are correct. For example, based on the detection of the edges of the substrate, a determination can be made whether the location of each edge is symmetrical with reference to a calculated center of the substrate with reference to a center of the pre-aligned chuck. If the center and rotational orientation are correct, the method 400 ends at operation 423.

If at least one of the center and rotational orientation are incorrect, the method 400 continues at operation 419 to transfer correction coordinates (e.g., x-offsets, y-offsets, z-offsets, and/or theta-offsets) to, for example, the translational stage 205 or the robotic-transfer mechanism for the substrate, as described above. Based on the transferred values of the correction coordinates, the substrate is repositioned at operation 421 so as to adjust for the correction coordinates. The method 400 ends at operation 423.

Continuing with an example of the method 400 for using the multi-camera pre-aligner system 230, for each captured image, the following operations may also be performed. Although not shown explicitly in FIG. 4 but understandable to a person of ordinary skill in the art upon reading and understanding the disclosed subject matter, a radial lens-correction may be inverted, if needed, to correct for lens distortions. For example, radial lens-distortion (e.g., a curvilinear distortion such as pincushion or barrel distortion) often exists in captured images as an artifact of the imaging system (e.g., a distortion originating with the lens of the camera). Estimating the radial lens-distortion, and preparing a radial lens-correction therefrom, can be realized using a convnet within the machine-learning framework described below, to prepare the radial lens-correction. A person of ordinary skill in the art will recognize that numerous architectures of a CNN, in addition to that shown in FIG. 5, can be used to perform a classification of images.

Figure 5:
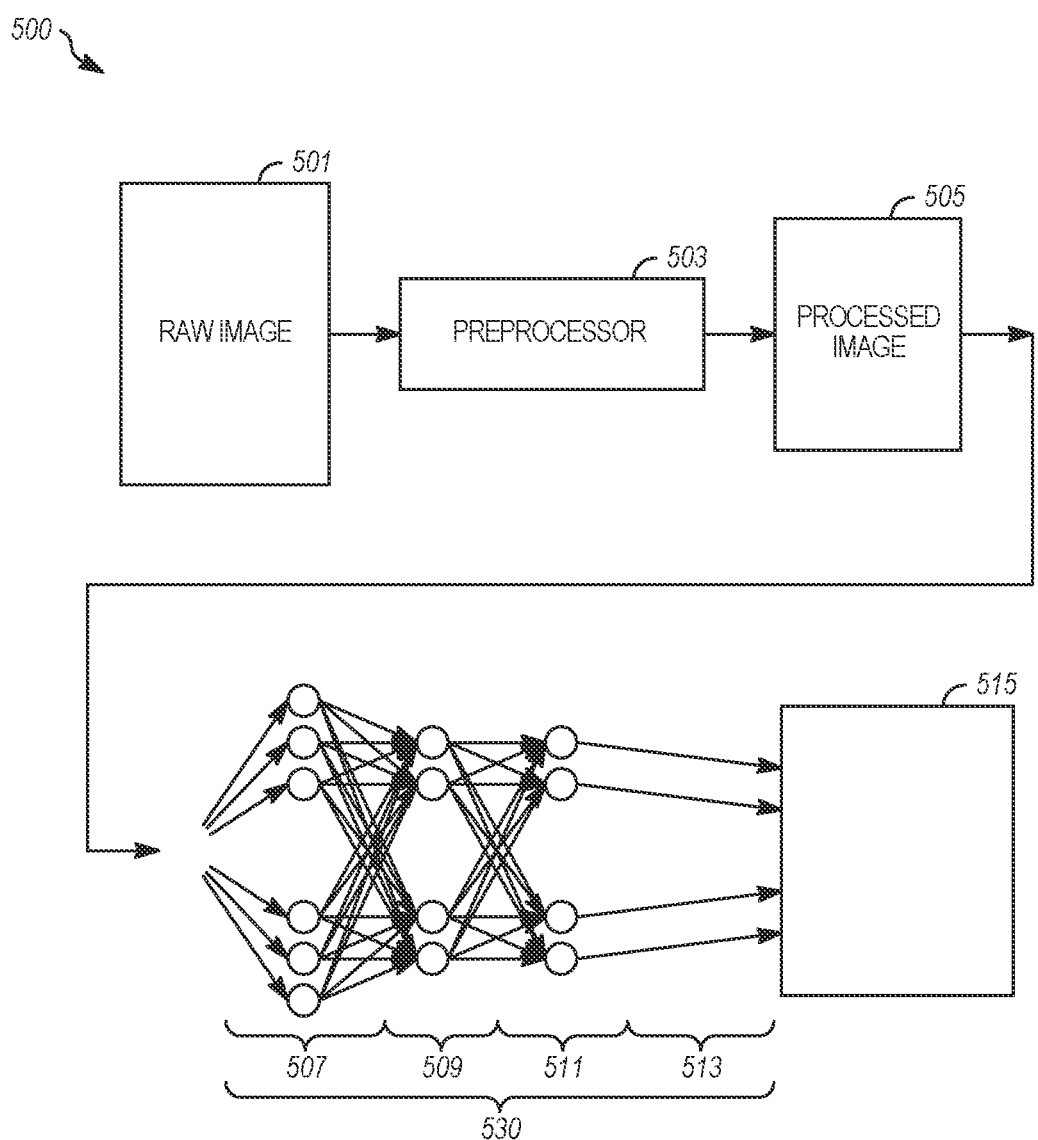
FIG. 5 shows an example of a machine-learning framework to detect fiducial marks (e.g., notches) on a substrate, as well as other desired features or characteristics of the substrate, in accordance with various embodiments of the disclosed subject matter.

FIG. 5 shows an example of a machine-learning framework 500 to detect fiducial marks (e.g., notches) on a substrate, as well as other desired features of the substrate as discussed above, in accordance with various embodiments of the disclosed subject matter. The location of the fiducial mark and other substrate characteristics are determined from images obtained from the pre-aligner system 200, 230 (see FIGS. 2A and 2B) and the substrate-characterization system described above. As described above, the machine-learning framework 500 may be used in a training mode to train, for example, a convnet within the machine-learning framework 500 and may then be used in normal-operation mode to characterize substrates (e.g., for a location of a fiducial) in a fabrication environment.

As shown in FIG. 5, the machine-learning framework 500 is shown to include a preprocessor 503 and a machine-learning network 530. A raw image 501 is provided to the preprocessor 503 in this example, the preprocessor 503 filters or otherwise processes the raw image 501 to, for example, crop, scale, or otherwise change or enhance the raw image 501 and to generate a preprocessed image 505.

The preprocessed image 505 may then be input into the machine-learning network 530. The machine-learning network 530 may be provided as a multi-layered machine learning model. For example, the machine-learning network 530 may include four layers including an input layer 507, a feature-extraction layer 509, a features-relationship layer 511, and a decision layer 513. In this exemplary model, the decision layer 513 may have a number of outputs. The outputs may include, e.g., a key point, a bounding box, a mask for fiducial location identification, and a mask for determination of an edge or edges of the substrate.

With continuing reference to FIG. 5, pixel information from the preprocessed image 505 may be sent to the input layer 507, Each node in the input layer 507 may correspond to a pixel of the preprocessed image 505. The machine-learning network 530 may, in an iterative fashion, may be trained in one or more of the layers 507 through 513. The decision layer 513 may output decisions regarding the various substrate characteristics of a given substrate, as noted above. The substrate characteristics are then generated in output box 515. The output box 515 may therefore store the extracted substrate characteristics from the raw image 501. In various embodiments, the output box 515 may provide a textual indication showing the substrate characteristics (e.g., substrate offsets in an x-direction, a y-direction, a z-direction, and/or a theta-direction, fiducial type(s) and locations; substrate bow and warp; substrate ID number, and other characteristics of the substrate). In various embodiments, values and/or characteristics within the output box 515 may be input as a command to, for example, direct a translational stage or a robot to reposition the substrate in expected x, y, z, and/or theta positions.

As noted above, the machine-learning framework 500 may first be used in a training mode to train the machine-learning network 530 to identify characteristics of the substrate. The machine-learning framework 500 may then be used in a normal-operation mode to identify characteristics of the substrate in a fabrication enviromnent. The training of the machine-learning network 530 may be a supervised process and may be performed offsite from where an identification of the characteristics of substrates is performed. The training may use a set of training images (e.g., one or more training images) with known substrate characteristics or determined features to train the machine-learning network 530.

Figure 6:
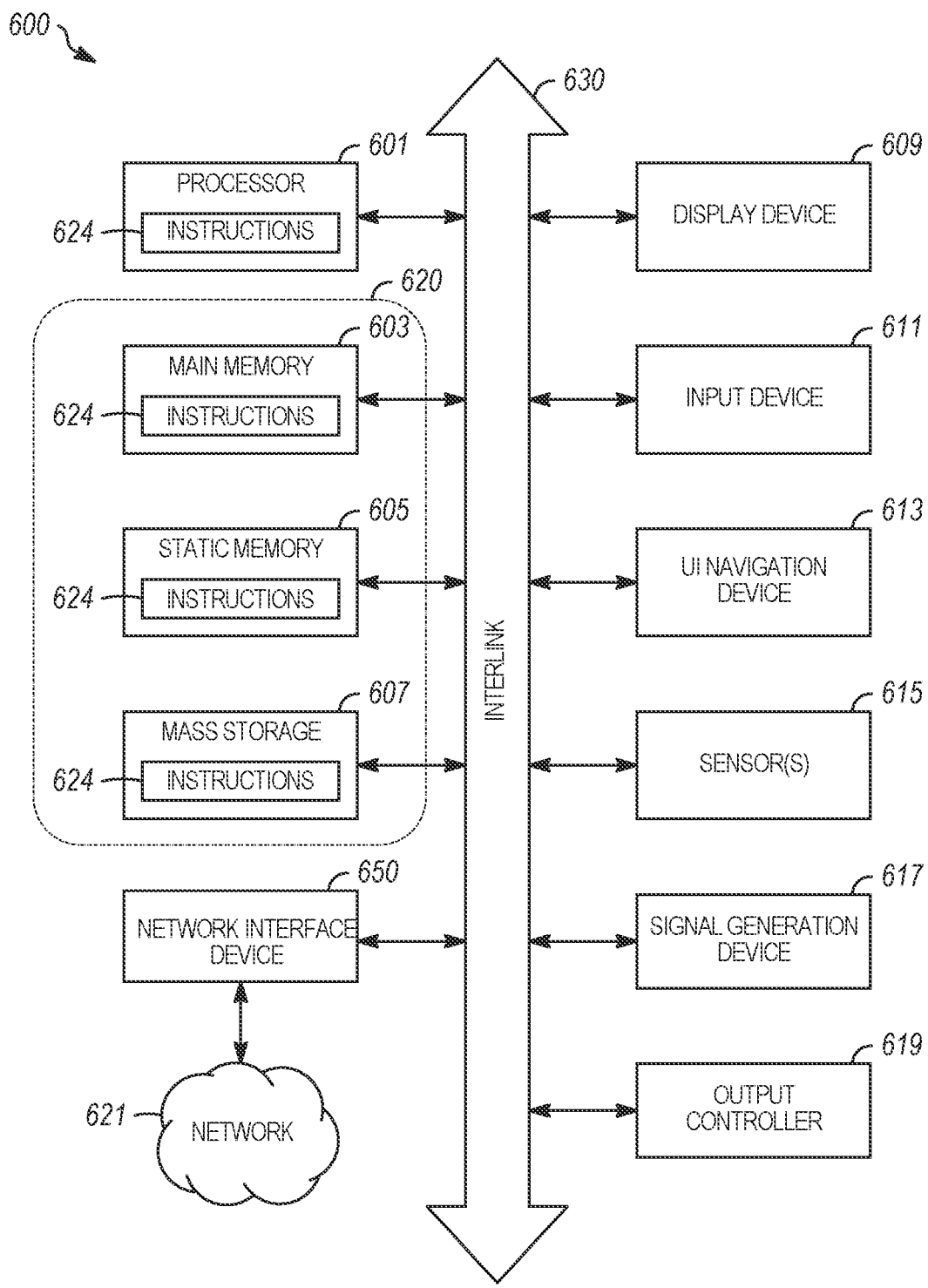
FIG. 6 shows a block diagram of an example comprising a machine upon which any one or more of the techniques (e.g., methodologies) discussed herein may be performed.

The techniques shown and described herein can be performed using a portion or an entirety of a machine 600 as discussed below in relation to FIG. 6. FIG. 6 shows an exemplary block diagram comprising a machine 600 upon which any one or more of the techniques (e.g., methodologies) discussed herein may be performed. In various examples, the machine 600 may operate as a standalone device or may be connected (e.g., networked) to other machines.

In a networked deployment, the machine 600 may operate in the capacity of a server machine, a client machine, or both in server-client network environments. In an example, the machine 600 may act as a peer machine in peer-to-peer (P2P) (or other distributed) network environment. The machine 600 may be a personal computer (PC), a tablet device, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations, Examples, as described herein, may include, or may operate by, logic or a number of components, or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, peribrm specified operations when operating. In an example, hardware of the circuitry may be immutably designed to carry out a specific operation (e.g., hardwired). In an example, the hardware comprising the circuitry may include variably connected physical components (e.g., execution units, transistors, simple circuits, etc.) including a computer-readable medium physically modified. (e.g., magnetically, electrically, such as via a change in physical state or transformation of another physical characteristic, etc.) to encode instructions of the specific operation. In connecting the physical components, the underlying electrical properties of a hardware constituent may be changed, for example, from an insulating characteristic to a conductive characteristic or vice versa. The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine 600 (e.g., computer system) may include a hardware-based processor 601 (e.g., a central processing unit (CPU), a graphics processing unit (GPU), a hardware processor core, or any combination thereof), a main memory 603 and a static memory 605, some or all of which may communicate with each other via an interlink 630 (e.g., a bus). The machine 600 may further include a display device 609, an input device 611 (e.g., an alphanumeric keyboard), and a user interface (UI) navigation device 613 (e.g., a mouse). In an example, the display device 609, the input device 611, and the UI navigation device 613 may comprise at least portions of a touch screen display. The machine 600 may additionally include a storage device 620 (e.g., a drive unit), a signal generation device (317 (e.g., a speaker), a network interface device 650, and one or more sensors 615, such as a global positioning system (GPS) sensor, compass, accelerometer, or other sensor. The machine 600 may include an output controller 619, such as a serial controller or interface (e.g., a universal serial bus (USB)), parallel controller or interface, or other wired or wireless (e.g., infrared (IR) controllers or interfaces, near field communication (NFC), etc., coupled to communicate or control one or more peripheral devices (e.g., a printer, a card reader, etc.).

The storage device 620 may include a machine readable medium on which is stored one or more sets of data structures or instructions 624 (e.g., software or firmware) embodying or utilized by any one or more of the techniques or functions described herein. The instructions 624 may also reside, completely or at least partially, within a main memory 603, within a static memory 605, within a mass storage device 607, or within the hardware-based processor 601 during execution thereof by the machine 600, In an example, one or any combination of the hardware-based processor 601, the main memory 603, the static memory 605, or the storage device 620 may constitute machine readable media.

While the machine readable medium is considered as a single medium., the term "machine readable medium" may include a single medium or multiple media (e.g., a centralized or distributed database, and/or associated caches and servers) configured to store the one or more instructions 624.

The term "machine readable medium" may include any medium that is capable of storing, encoding, or carrying instructions for execution by the machine 600 and that cause the machine 600 to perform any one or more of the techniques of the present disclosure, or that is capable of storing, encoding or carrying data structures used by or associated with such instructions. Non-limiting machine-readable medium examples may include solid-state memories, and optical and magnetic media. Accordingly, machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic or other phase-change or state-change memory circuits; magnetic disks, such as internal hard disks and removable disks; magneto-optical disks; and CD-ROM and DVD-ROM disks.

The instructions 624 may further be transmitted or received over a communications network 621 using a transmission medium via the network interface device 650 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., the Institute of Electrical and Electronics Engineers (IEEE) 802.22 family of standards known as the IEEE 802.26 family of standards known as WiMax®), the IEEE 802.25.4 family of standards, peer-to-peer (P2P) networks, among others. In an example, the network interface device 650 may include one or more physical jacks (e.g., Ethernet, coaxial, or phone jacks) or one or more antennas to connect to the communications network 626. In an example, the network interface device 650 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 600, and includes digital or analog communications signals or other intangible medium to facilitate communication of such software.

As used herein, the term "or" may be construed in an inclusive or exclusive sense. Further, other embodiments will be understood by a person of ordinary skill in the art based upon reading and understanding the disclosure provided. Moreover, the person of ordinary skill in the art will readily understand that various combinations of the techniques and examples provided herein may all be applied in various combinations.

Throughout this specification, plural instances may implement components, operations, or structures described as a single instance. Although individual operations are illustrated and described as separate operations, one or more of the individual operations may be performed concurrently, and, unless otherwise stated, nothing requires that the operations necessarily be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter described herein.

Further, although not shown explicitly but understandable to a skilled artisan, each of the various arrangements, quantities, and number of elements may be varied (e.g., the number of cameras) Moreover, each of the examples shown and described herein is merely representative of one possible configuration and should not be taken as limiting the scope of the disclosure.

Although various embodiments are discussed separately, these separate embodiments are not intended to be considered as independent techniques or designs. As indicated above, each of the various portions may be inter-related and each may be used separately or in combination with other embodiments discussed herein. For example, although various embodiments of operations, systems, and processes have been described, these methods, operations, systems, and processes may be used either separately or in various combinations.

Consequently, many modifications and variations can be made, as will be apparent to a person of ordinary skill in the art upon reading and understanding the disclosure provided herein. Functionally equivalent methods and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to ascertain quickly the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims Thus, the following claims are hereby incorporated into the Detailed Description, with each claim standing on its own as a separate embodiment.

The description provided herein includes illustrative examples, devices, and apparatuses that embody various aspects of the matter described in this document. In the description, for purposes of explanation, numerous specific details are set forth in order to provide an understanding of various embodiments of the matter discussed. It will be evident however, to those of ordinary skill in the art, that various embodiments of the disclosed subject matter may be practiced without these specific details. Further, well-known structures, materials, and techniques have not been shown in detail, so as not to obscure the various illustrated embodiments. As used herein, the terms "about," "approximately," and "substantially" may refer to values that are, for example, within +10% of a given value or range of values.

THE FOLLOWING NUMBERED EXAMPLES ARE SPECIFIC EMBODIMENTS OF THE DISCLOSED SUBJECT MATTER

Example 1: An apparatus to detect and pre-align a fiducial located on a substrate to a predetermined location on a substrate holder. The apparatus includes at least one camera to be positioned over the substrate when the substrate is located on the substrate holder. The at least one camera is configured to capture a plurality of images of at least a top surface of the substrate, with at least two of the plurality of images showing at least partially unique views of the substrate. A hardware-based processor is configured to determine a location of an edge of the substrate based on the plurality of captured images. The hardware-based processor is further configured to determine a characteristic dimension of the substrate across the top surface, determine a location of the fiducial on the substrate, calculate at least an x-direction offset, a y-direction offset, and a theta-direction offset of the substrate from the predetermined location on the substrate holder, and determine a location of the fiducial based on the plurality of captured images.

Example 2: The apparatus of Example 1, further comprising a rotation stage coupled to the substrate holder to rotate the substrate at least about 180 degrees from an original 0-degree position of placement on the substrate holder, the at least one camera being configured to acquire at least one image of the substrate at each of 0-degrees and about 180-degrees, the acquired at least one image of the substrate at each of 0-degrees and about 180-degrees thereby showing the at least partially unique views of the substrate.

Example 3: The apparatus of Example 2, wherein the hardware-based processor is configured to determine a location of an edge of the substrate based on the at least one image taken at each of 0-degrees and about 180-degrees.

Example 4: The apparatus of any of the preceding Examples, wherein the fiducial comprises at least one type of fiducial including types selected from a notch and a flat on the substrate.

Example 5: The apparatus of any of the preceding Examples, wherein the apparatus is configured to pre-align a clear substrate.

Example 6: The apparatus of any of the preceding Examples, wherein the apparatus is configured to discern a substrate identification code, based on optical character recognition, wherein the substrate identification code is located on the top surface of the substrate.

Example 7: The apparatus of any of the preceding Examples, further comprising at least one camera located below the substrate during a pre-alignment procedure.

Example 8: The apparatus of any of the preceding Examples, wherein the hardware-based processor includes a convolutional neural-network.

Example 9: The apparatus of any of the preceding Examples, wherein the hardware-based processor is further configured to determine an offset of the fiducial on the substrate from the predetermined location on the substrate holder in a z-direction.

Example 10: The apparatus of any of the preceding Examples, wherein the characteristic dimension is a diameter of the substrate.

Example 11: The apparatus of any of the preceding Examples, wherein the hardware-based processor is further configured to determine an amount of bow in the substrate based on the plurality of captured images.

Example 12: The apparatus of any of the preceding Examples, wherein the x-direction offset, the y-direction offset, and the theta-direction offset of the substrate from the predetermined location on the substrate holder is to be transferred to a substrate-transfer robot.

Example 13: The apparatus of Example 12, wherein the substrate-transfer robot is configured to relocate the substrate to the predetermined location on the substrate holder based on the transferred values of the x-direction offset, the y-direction offset, and the theta-direction offset.

Example 14: The apparatus of any of the preceding Examples, wherein the x-direction offset, the y-direction offset, and the theta-direction offset of the substrate from the predetermined location on the substrate holder is to be transferred to the substrate holder.

Example 15: The apparatus of Example 14, wherein the substrate holder is configured to move the substrate to a location of the predetermined location on the substrate holder based on the transferred values of the x-direction offset, the y-direction offset, and the theta-direction offset Example 16: The apparatus of any of the preceding Examples, wherein the hardware-based processor is configured to apply a neural network to the plurality of images captured from the substrate to determine a location of the fiducial on bonded substrates.

Example 17: A method for pre-aligning a fiducial located on a substrate to a predetermined location on a substrate holder. The method includes capturing at least one first image of at least a top surface of the substrate and capturing at least one second image of at least the top surface of the substrate, where the at least one first image and the at least one second image show at least partially unique views of the substrate. The at least one first image and the at least one second image are processed to determine a location of the fiducial, with the processing further including calculating at least an x-direction offset, a y-direction offset, and a theta-direction offset of the substrate from the predetermined location on the substrate holder.

Example 18: The method of Example 17, further comprising rotating the substrate at least about 180 degrees from an original 0-degree position of placement on the substrate holder between the capturing of the first image and the capturing of the second image, the processor being further configured to determine a location of the fiducial from the at least one image taken at each of 0-degrees and 180-degrees.

Example 19: The method of either Example 17 or Example 18, further comprising determining the location of the fiducial on both bonded substrates and unbonded substrates from the at least one first image and the at least one second image.

Example 20: The method of any one of Example 17 through Example 19, further comprising processing the at least one first image and the at least, one second image to determine a characteristic dimension of the substrate across the top surface of the substrate.

Example 21: The method of any one of Example 17 through Example 20, further comprising discerning a substrate identification code, based on optical character recognition, from one of the at least one first image and the at least one second image, wherein the substrate identification code is located on the top surface of the substrate, Example 22: The method of any one of Example 17 through Example 21, wherein the processing includes using a convolutional neural-network to determine characteristics of the substrate.

Example 23: A computer-readable medium containing instructions that, when executed by a machine, cause the machine to perform operations including receiving at least one first image of at least, a top surface of the substrate and receiving at least one second image of at least the top surface of the substrate. The at least one first image and the at least one second image show at least partially unique views of the substrate. The at least one first image and the at least one second image are processed to determine a location of the fiducial on the substrate. The processing further including calculating at least an x-direction offset, a v-direction offset, and a theta-direction offset of the substrate from the predetermined location on the substrate holder, and determining a location of the fiducial based on the at least one first image and the at least one second image.

Example 24: The computer-readable medium of Example 23, wherein the operations further comprise determining the location of the fiducial on both bonded substrates and unbonded substrates from the at least one first image and the at least one second image.

Example 25: The computer-readable medium of either one of Example 23 or Example 24, wherein the operations further comprise processing the at least one first image and the at least one second image to determine a characteristic dimension of the substrate across the top surface of the substrate.

Example 26: The computer-readable medium of any one of Example 23 through Example 25, wherein the operations further comprise using a convolutional neural-network to determine characteristics of the substrate.

Example 27: A method for pre-aligning a fiducial located on a substrate to a predetermined location on a substrate holder. The method includes capturing at least one unique image of the substrate after the substrate is placed on the substrate holder by each of a plurality of cameras; processing each of the captured images; determining at least one edge of the substrate from the processed images; determining a location of the fiducial on the substrate from the processed images; and calculating, from the processed images, at least an x-direction offset, a y-direction offset, and a theta-direction offset of the substrate from a predetermined location on the substrate holder.

Example 28: The method of Example 27, further comprising determining the location of the fiducial on both bonded substrates and unbonded substrates from the processed images.

Example 29: The method of either one of Example 27 or Example 28, further comprising processing the captured images for determining a characteristic dimension of the substrate across a top surface of the substrate.

Example 30: The method of any one of Example 27 through Example 29, further comprising discerning a substrate identification code, based on optical character recognition, from at least one of the captured images, wherein the substrate identification code is located on a top surface of the substrate.

Example 31: The method of any one of Example 27 through Example 30, further comprising converting pixel units from the captured images into physical units.

What is claimed is:

1. An apparatus to detect and pre-align a fiducial located on a substrate to a predetermined location on a substrate holder, the apparatus comprising:
at least one camera to be positioned over the substrate when the substrate is located on the substrate holder, the at least one camera to capture a plurality of images of at least a top surface of the substrate, at least two of the plurality of images showing at least partially unique views of the substrate, the at least partially unique views of the substrate including views from at least partially different locations on the substrate; and
a hardware-based processor to determine a location of an edge of the substrate based on the plurality of captured images, the hardware-based processor further to determine a characteristic dimension of the substrate across the top surface, determine a location of the fiducial on the substrate, calculate at least an x-direction offset, a y-direction offset, and a theta-direction offset of the substrate from the predetermined location on the substrate holder, and determine a location of the fiducial based on the plurality of captured images.

2. The apparatus of claim 1, further comprising a rotation stage coupled to the substrate holder to rotate the substrate at least about 180 degrees from an original 0-degree position of placement on the substrate holder, the at least one camera being configured to acquire at least one image of the substrate at each of 0-degrees and about 180-degrees, the acquired at least one image of the substrate at each of 0-degrees and about 180-degrees thereby showing the at least partially unique views of the substrate.

3. The apparatus of claim 2, wherein the hardware-based processor is configured to determine a location of an edge of the substrate based on the at least one image taken at each of 0-degrees and about 180-degrees.

4. The apparatus of claim 1, wherein the fiducial comprises at least one type of fiducial including types selected from a notch and a flat on the substrate.

5. The apparatus of claim 1, wherein the apparatus is configured to pre-align a clear substrate.

6. The apparatus of claim 1, wherein the apparatus is configured to discern a substrate identification code, based on optical character recognition, wherein the substrate identification code is located on the top surface of the substrate.

7. The apparatus of claim 1, further comprising at least one camera located below the substrate during a pre-alignment procedure.

8. The apparatus of claim 1, wherein the hardware-based processor includes a convolutional neural-network.

9. The apparatus of claim 8, wherein the hardware-based processor is further configured to determine an offset of the fiducial on the substrate from the predetermined location on the substrate holder in a z-direction.

10. The apparatus of claim 1, wherein the characteristic dimension is a diameter of the substrate.

11. The apparatus of claim 1, wherein the hardware-based processor is further configured to determine an amount of bow in the substrate based on the plurality of captured images.

12. The apparatus of claim 1, wherein the x-direction offset, the y-direction offset, and the theta-direction offset of the substrate from the predetermined location on the substrate holder is to be transferred to a substrate-transfer robot.

13. The apparatus of claim 12, wherein the substrate-transfer robot is configured to relocate the substrate to the predetermined location on the substrate holder based on the transferred values of the x-direction offset, the y-direction offset, and the theta-direction offset.

14. The apparatus of claim 1, wherein the x-direction offset, the y-direction offset, and the theta-direction offset of the substrate from the predetermined location on the substrate holder is to be transferred to the substrate holder.

15. The apparatus of claim 14, wherein the substrate holder is configured to move the substrate to a location of the predetermined location on the substrate holder based on the transferred values of the x-direction offset, the y-direction offset, and the theta-direction offset.

16. The apparatus of claim 1, wherein the hardware-based processor is configured to apply a neural network to the plurality of images captured from the substrate to determine a location of the fiducial on bonded substrates.

17. The apparatus of claim 1, wherein the plurality of images having at least one type of image is selected from image types including a color image and a gray-scale image.

18. A method for pre-aligning a fiducial located on a substrate to a predetermined location on a substrate holder, the method comprising:
   capturing at least one first image of at least a top surface of the substrate;
   capturing at least one second image of at least the top surface of the substrate, the at least one first image and the at least one second image showing at least partially unique views of the substrate, the at least partially unique views of the substrate including views from at least partially different locations on the substrate;
   processing the at least one first image and the at least one second image to determine a location of the fiducial, the processing further including calculating at least an x-direction offset, a y-direction offset, and a theta-direction offset of the substrate from the predetermined location on the substrate holder.

19. The method of claim 18, further comprising rotating the substrate at least about 180 degrees from an original 0-degree position of placement on the substrate holder between the capturing of the first image and the capturing of the second image, the processor being further configured to determine a location of the fiducial from the at least one image taken at each of 0-degrees and 180-degrees.

20. The method of claim 18, further comprising determining the location of the fiducial on both bonded substrates and unbonded substrates from the at least one first image and the at least one second image.

21. The method of claim 18, further comprising processing the at least one first image and the at least one second image to determine a characteristic dimension of the substrate across the top surface of the substrate.

22. The method of claim 18, further comprising discerning a substrate identification code, based on optical character recognition, from one of the at least one first image and the at least one second image, wherein the substrate identification code is located on the top surface of the substrate.

23. The method of claim 18, wherein the processing includes using a convolutional neural-network to determine characteristics of the substrate.

24. The method of claim 18, where the at least one first image and the at least one second image are selected from image types including a color image and a gray-scale image.

25. A computer-readable medium containing instructions that, when executed by a machine, cause the machine to perform operations comprising:
   receiving at least one first image of at least a top surface of the substrate;
   receiving at least one second image of at least the top surface of the substrate, the at least one first image and the at least one second image showing at least partially unique views of the substrate, the at least partially unique views of the substrate including views from at least partially different locations on the substrate;
   processing the at least one first image and the at least one second image to determine a location of the fiducial on the substrate, the processing further including calculating at least an x-direction offset, a y-direction offset, and a theta-direction offset of the substrate from the predetermined location on the substrate holder, and determining a location of the fiducial based on the at least one first image and the at least one second image.

26. The computer-readable medium of claim 25, wherein the operations further comprise determining the location of the fiducial on both bonded substrates and unbonded substrates from the at least one first image and the at least one second image.

27. The computer-readable medium of claim 25, wherein the operations further comprise processing the at least one first image and the at least one second image to determine a characteristic dimension of the substrate across the top surface of the substrate.

28. The computer-readable medium of claim 25, wherein the operations further comprise using a convolutional neural-network to determine characteristics of the substrate.

29. The computer-readable medium of claim 25, where the at least one first image and the at least one second image are selected from image types including a color image and a gray-scale image.

30. A method for pre-aligning a fiducial located on a substrate to a predetermined location on a substrate holder, the method comprising:
   capturing at least one unique image of the substrate after the substrate is placed on the substrate holder by each of a plurality of cameras, the at least one unique image of the substrate by each of the plurality of cameras including views from at least partially different locations on the substrate;
   processing each of the captured images;
   determining at least one edge of the substrate from the processed images;
   determining a location of the fiducial on the substrate from the processed images; and
   calculating, from the processed images, at least an x-direction offset, a y-direction offset, and a theta-direction offset of the substrate from a predetermined location on the substrate holder.

31. The method of claim 30, further comprising determining the location of the fiducial on both bonded substrates and unbonded substrates from the processed images.

32. The method of claim 30, further comprising processing the captured images for determining a characteristic dimension of the substrate across a top surface of the substrate.

33. The method of claim 30, further comprising discerning a substrate identification code, based on optical character recognition, from at least one of the captured images, wherein the substrate identification code is located on a top surface of the substrate.

34. The method of claim 30, further comprising converting pixel units from the captured images into physical units.

35. The method of claim 30, wherein each of the at least one unique image of the substrate after the substrate is placed on the substrate holder by each of the plurality of cameras is selected from image types including a color image and a gray-scale image.

* * * * *

UNITED STATES PATENT AND TRADEMARK OFFICE
CERTIFICATE OF CORRECTION

| | |
|---|---|
| PATENT NO. | : 12,237,198 B2 |
| APPLICATION NO. | : 17/840154 |
| DATED | : February 25, 2025 |
| INVENTOR(S) | : Jason Paul Remillard, Neil Casa and Stephen W. Into |

Page 1 of 3

It is certified that error appears in the above-identified patent and that said Letters Patent is hereby corrected as shown below:

In the Specification

Column no 4 Line no 27-28, "Each of the listed substrate types may include notches and single-flat or single-fiat and secondary-flat fiducials." to read as, "Each of the listed substrate types may include notches and single-flat or single-flat and secondary-flat fiducials."

Column no 5 Line no 11-12, "e.g., the bonded substrate 100 of FIG. 1A or any bonded substrate or unbond.ed substrate" to read as, "e.g., the bonded substrate 100 of FIG. 1A or any bonded substrate or unbonded substrate"

Column no 5 Line no 15-16, "for example, an x-direction, a v-direction, a z-direction, and a theta-direction" to read as, "for example, an x-direction, a y-direction, a z-direction, and a theta-direction"

Column no 7 Line no 36-38, "several characteristics e.g., location of a fiducial (a notch), theta-offset, x-direction offset and y-direction offset etc.)" to read as, "several characteristics (e.g., location of a fiducial (a notch), theta-offset, x-direction offset and y-direction offset etc.)"

Column no 8 Line no 6-7, "if present, such as on a wafer containing printed andior etched dice" to read as, "if present, such as on a wafer containing printed and/or etched dice"

Column no 8 Line no 66-67, "the substrate may be rotated about 1800 at operation 303" to read as, "the substrate may be rotated about 180° at operation 303"

Column no 9 Line no 1-2, "the substrate (e.g., about) 90° or no rotations are used depending on an angle-of-view of the cameras" to read as, "the substrate (e.g., about 90°) or no rotations are used depending on an angle-of-view of the cameras"

Column no 9 Line no 24-25, "e.g., virtually overplayed in the machine-learning framework" to read as, "e.g., virtually overlayed in the machine-learning framework"

Signed and Sealed this
Twenty-sixth Day of August, 2025

Coke Morgan Stewart
*Acting Director of the United States Patent and Trademark Office*

CERTIFICATE OF CORRECTION (continued)
U.S. Pat. No. 12,237,198 B2

Column no 9 Line no 35-36, "based on the detection of the edges of the substrate, a determination can be inad.e" to read as, "based on the detection of the edges of the substrate, a determination can be made"

Column no 9 Line no 43-44, "e.g., x-offsets, v-offsets, and/or theta-offsets" to read as, "e.g., x-offsets, y-offsets, and/or theta-offsets"

Column no 9 Line no 47-48, "the substrate is repositioned at operation 315, The method 300 ends at operation" to read as, "the substrate is repositioned at operation 315, The method 300 ends at operation 311"

Column no 11 Line no 8-9, "the additional image when the two images are overlaved on each other" to read as, "the additional image when the two images are overlayed on each other"

Column no 11 Line no 15-16, "at least one additional image from an additional samara or cameras" to read as, "at least one additional image from an additional camara or cameras"

Column no 13 Line no 28-29, "normal-operation mode to identify characteristics of the substrate in a fabrication enviromnent" to read as, "normal-operation mode to identify characteristics of the substrate in a fabrication environment"

Column no 14 Line no 1-3, "Circuitries include members that may, alone or in combination, peribrm specified operations when operating" to read as, "Circuitries include members that may, alone or in combination, perform specified operations when operating"

Column no 14 Line no 42, "a signal generation device (317 (e.g., a speaker)" to read as, "a signal generation device 617 (e.g., a speaker)"

Column no 14 Line no 47-48, "(e.g., a universal serial bus (USB)), parallel controller or interface, or other wired or wireless" to read as, "(e.g., a universal serial bus (USB)), a parallel controller or interface, or other wired or wireless"

Column no 15 Line no 35-36, "802.22 family of standards known as the IEEE 802.26 family of standards known as WiMax®" to read as, "802.22 family of standards known as Wi-Fi®, the IEEE 802.26 family of standards known as WiMax®"

Column no 16 Line no 66-67, "for example, within +10% of a given value or range of values" to read as, "for example, within ±10% of a given value or range of values"

Column no 17 Line no 62-63, "hardware-based processor is further configured to determine an amount of how in the substrate" to read as, "hardware-based processor is further configured to determine an amount of bow in the substrate"

Column no 18 Line no 9-10, "wherein the x-direction offset, the v-direction offset, and the theta-direction offset of the substrate" to read as, "wherein the x-direction offset, the y-direction offset, and the theta-direction offset of the substrate"

CERTIFICATE OF CORRECTION (continued)
U.S. Pat. No. 12,237,198 B2

Column no 19 Line no 5-6, "The processing further including calculating at least an x-direction offset, a v-direction offset" to read as, "The processing further including calculating at least an x-direction offset, a y-direction offset"